United States Patent
Daniels et al.

(10) Patent No.: US 6,421,619 B1
(45) Date of Patent: Jul. 16, 2002

(54) DATA PROCESSING SYSTEM AND METHOD INCLUDED WITHIN AN OSCILLOSCOPE FOR INDEPENDENTLY TESTING AN INPUT SIGNAL

(75) Inventors: Scott Leonard Daniels, Cedar Park; David Edward Halter, Austin, both of TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/165,881

(22) Filed: Oct. 2, 1998

(51) Int. Cl.[7] .............................................. G01R 13/32
(52) U.S. Cl. ........................ 702/66; 702/68; 702/76; 324/76.19; 324/76.25; 324/121 R
(58) Field of Search .......................... 702/66, 119, 189, 702/67, 68, 76, 79; 324/121 R, 76.19, 76.25, 102; 368/115

(56) References Cited

U.S. PATENT DOCUMENTS

| | | | |
|---|---|---|---|
| 4,585,975 A | * 4/1986 | Wimmer | 702/67 |
| 4,680,778 A | 7/1987 | Krinock | 375/97 |
| 4,716,574 A | 12/1987 | Baier et al. | 375/1 |
| 4,823,076 A | * 4/1989 | Haines et al. | 702/67 |
| 4,855,968 A | * 8/1989 | Shank | 368/115 |
| 5,033,826 A | 7/1991 | Kolner | 350/355 |
| 5,210,483 A | 5/1993 | Amamoto et al. | 324/76.27 |
| 5,483,617 A | 1/1996 | Patterson et al. | 395/2.16 |
| 5,610,847 A | 3/1997 | Kundert | 364/576 |

* cited by examiner

Primary Examiner—John S. Hilten
Assistant Examiner—Hien Vo
(74) Attorney, Agent, or Firm—Leslie A. Van Leeuwen; Bracewell & Patterson, L.L.P.

(57) ABSTRACT

A data processing system and method included within an oscilloscope for independently analyzing a signal input into the oscilloscope. The oscilloscope includes a plurality of triggering modes. A plurality of trigger parameters are specified for each of the triggering modes. Thereafter, the oscilloscope automatically analyzes the input signal, independently from any user input, utilizing each of the triggering modes and the trigger parameters specified for each of the triggering modes. The input signal includes a desired waveform and a plurality of undesired waveforms. While the oscilloscope is automatically analyzing the input signal, a determination is made regarding whether the oscilloscope triggered on one of the undesired waveforms. When it is determined that the oscilloscope triggered on one of the undesired waveforms, the undesired waveform upon which the oscilloscope triggered is stored.

24 Claims, 3 Drawing Sheets

DATA PROCESSING SYSTEM AND METHOD INCLUDED WITHIN AN OSCILLOSCOPE FOR INDEPENDENTLY TESTING AN INPUT SIGNAL

BACKGROUND OF THE INVENTION

1. Field of the Invention

The present invention relates in general to data processing systems and, in particular, to a data processing system included within an oscilloscope for automatically and independently testing an input signal. Still more particularly, the present invention relates to a data processing system and method included within an oscilloscope for automatically analyzing an input signal, independently from any user input, utilizing each of a plurality of triggering modes and trigger parameters specified for each of the triggering modes.

2. Description of the Related Art:

Oscilloscopes are known in the art for receiving test signals from a circuit-under-test and for displaying those signals as a function of voltage (or current) versus time. The oscilloscope is set to trigger on a particular point of the input waveform. Triggering parameters, such as type of triggering mode and horizontal and vertical sweep are manually set on the oscilloscope. Once the input signal is tested utilizing a set of triggering parameters, a user of the oscilloscope may manually reset the oscilloscope to a different set of triggering parameters.

Many different triggering modes are known in the art. The modes include edge triggering, slew, glitch, runt, pulse width, or time-out triggering. A user may select any of the triggering modes available on the oscilloscope. Once the input signal has been analyzed utilizing one of the modes, the user may manually set the oscilloscope to a different triggering mode.

Modern oscilloscopes often include a data processing system. The data processing system is utilized by the oscilloscope to assist a user in properly triggering on the input signal. When utilizing modern oscilloscopes which include an internal data processing system, the need for the user to "find" the input signal on the display screen by continually changing the horizontal and vertical sweep settings is significantly reduced.

However, even when utilizing modern oscilloscopes, the user must select a particular triggering mode including triggering parameters, and analyze the displayed waveform. The user must still manually change the selected triggering mode including triggering parameters.

Therefore a need exists for a method and system in a data processing system and method included within an oscilloscope for automatically analyzing an input signal utilizing each of a plurality of triggering modes and trigger parameters specified for each of the triggering modes, such that a user's input during the analysis is not required.

SUMMARY OF THE INVENTION

It is therefore one object of the present invention to provide an improved data processing system.

It is another object of the present invention to provide a method and system in a data processing system included within an oscilloscope for automatically testing an input signal independently from any user input.

It is yet another object of the present invention to provide a data processing system and method included within an oscilloscope for automatically analyzing an input signal, independently from any user input, utilizing each of a plurality of triggering modes and trigger parameters specified for each of the triggering modes.

The foregoing objects are achieved as is now described. A data processing system and method included within an oscilloscope for independently analyzing a signal input into the oscilloscope. The oscilloscope includes a plurality of triggering modes. A plurality of trigger parameters are specified for each of the triggering modes. Thereafter, the oscilloscope automatically analyzes the input signal, independently from any user input, utilizing each of the triggering modes and the trigger parameters specified for each of the triggering modes. The input signal includes a desired waveform and a plurality of undesired waveforms. While the oscilloscope is automatically analyzing the input signal, a determination is made regarding whether the oscilloscope triggered on one of the undesired waveforms. When it is determined that the oscilloscope triggered on one of the undesired waveforms, the undesired waveform upon which the oscilloscope triggered is stored.

The above as well as additional objectives, features, and advantages of the present invention will become apparent in the following detailed written description.

DESCRIPTION OF THE DRAWINGS

The novel features are set forth in the appended claims. The present invention itself, however, as well as a preferred mode of use, further objectives, and advantages thereof, will best be understood by reference to the following detailed description of a preferred embodiment when read in conjunction with the accompanying drawings, wherein:

DETAILED DESCRIPTION OF A PREFERRED EMBODIMENT

Figure 1:
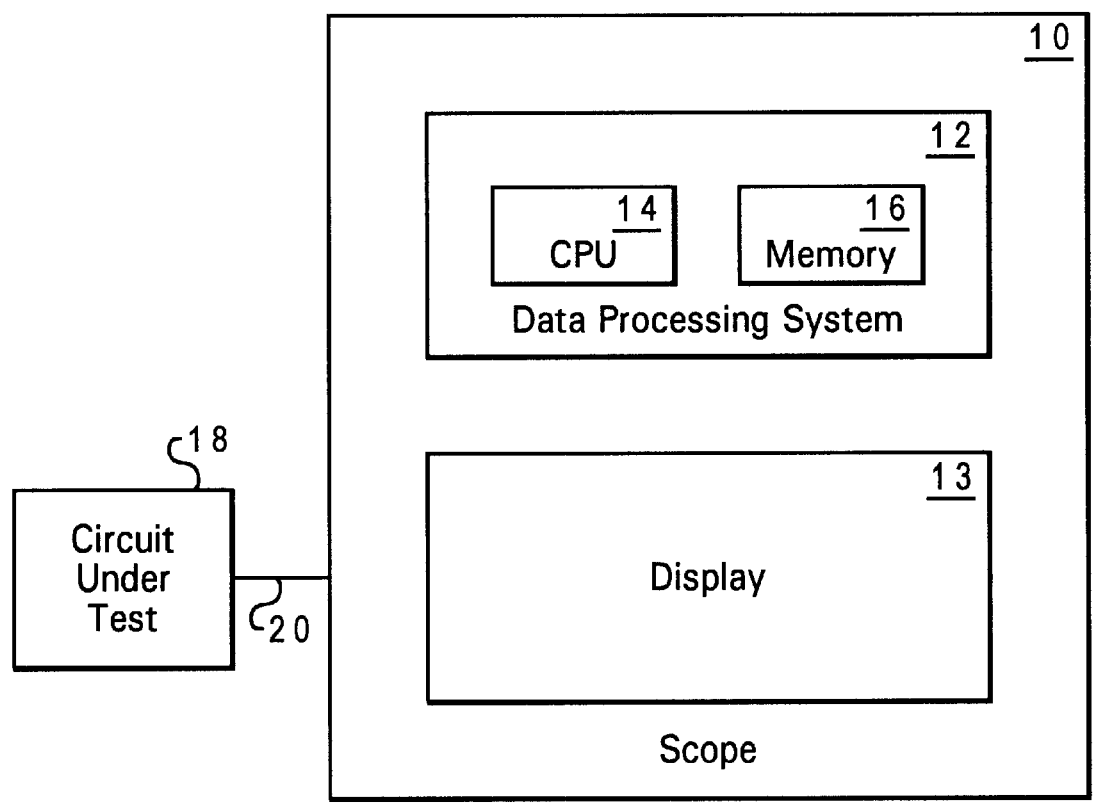
FIG. 1 illustrates a pictorial representation of an oscilloscope including a data processing system which may be utilized to implement the method and system of the present invention.
Figure 2:
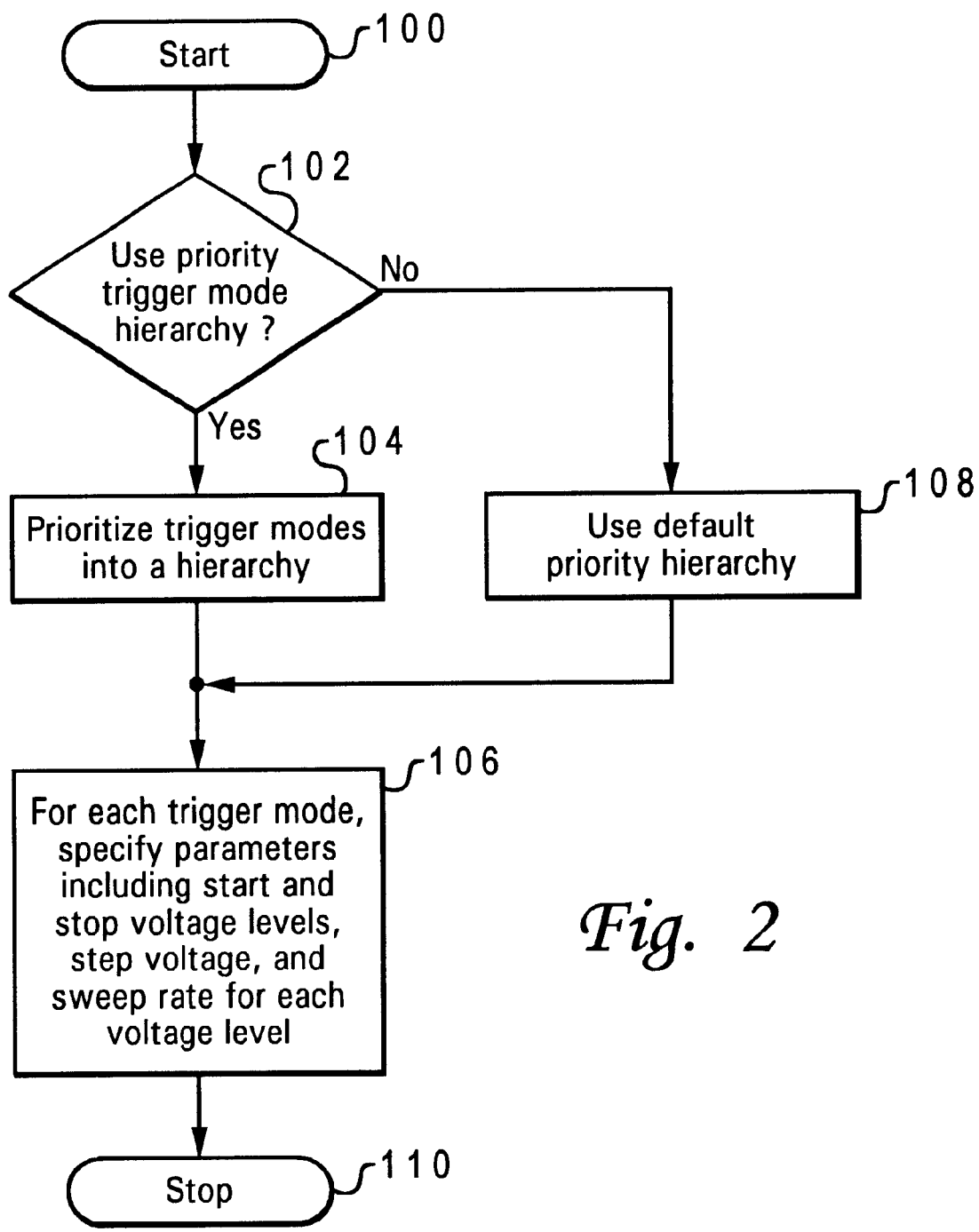
FIG. 2 depicts a high level flow chart illustrating a prioritization of a plurality of triggering modes, and the specification of a plurality of parameters for each of the plurality of triggering modes in accordance with the method and system of the present invention.
Figure 3:
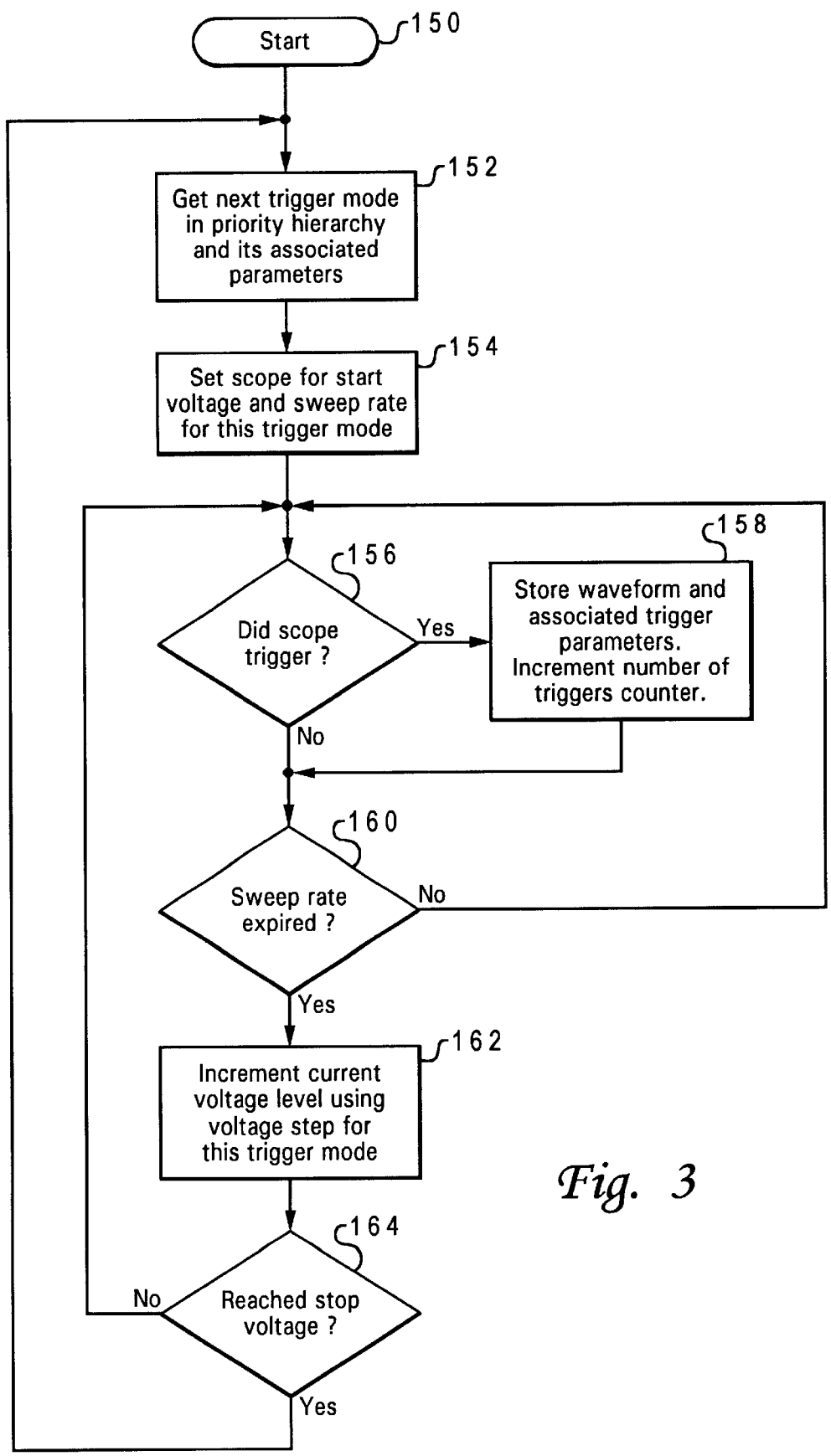
FIG. 3 illustrates a high level flow chart depicting an automatic and independent analysis of an input signal by an oscilloscope utilizing a plurality of triggering modes and their associated parameters in accordance with the method and system of the present invention.

A preferred embodiment of the present invention and its advantages are better understood by referring to FIGS. 1–3 of the drawings, like numerals being used for like and corresponding parts of the accompanying drawings.

The present invention is utilized by a data processing system included within an oscilloscope to efficiently analyze a signal input into the oscilloscope. The input signal includes a desired waveform and various undesired waveforms. The undesired waveforms include noise, slew, and other anomaly waveforms. The present invention is directed to an analysis of the undesired waveforms.

The user may wish to further analyze the undesired waveforms. However, due to the erratic nature of some of the undesired waveforms, they may be difficult to view on an older or even a modern oscilloscope. Although a modern oscilloscope will assist the user during triggering on a signal, a user must still manually select a particular triggering mode and triggering parameters.

According to the present invention, an oscilloscope including a data processing system will automatically and independently from a user input analyze a signal input into the oscilloscope. The oscilloscope automatically analyzes undesired waveforms included within the input signal utilizing each of the triggering modes and the trigger parameters specified for each of the triggering modes. Any type of triggering mode may be selected, such as edge triggering, slew, glitch, runt, pulse width, time-out triggering, or any other type of triggering mode.

While the oscilloscope is automatically analyzing the input signal, a determination is made regarding whether the oscilloscope triggered on one of the undesired waveforms. When it is determined that the oscilloscope triggered on one of the undesired waveforms, the undesired waveform upon which the oscilloscope triggered is stored.

The user may specify a priority hierarchy for the triggering modes. When a priority hierarchy is specified, the oscilloscope will test the input signal utilizing that order of triggering modes. When a priority hierarchy is not specified, a default priority hierarchy is utilized. Any order of trigger modes may be specified as a default priority hierarchy.

A user may specify a sweep rate, start voltage level, stop voltage level, and step voltage level for each triggering mode. Further, the user may specify a different sweep rate for each voltage level for each triggering mode.

Thereafter, the oscilloscope will analyze the input signal starting with the highest priority triggering mode, and utilizing a current voltage level, which initially is the start voltage level, and the sweep rate associated with that voltage level. Thereafter, the current voltage level will be incremented by adding the step voltage level to the current voltage level. The sweep rate associated with the new current voltage level will be utilized. This process will continue until the current voltage level is equal to the stop voltage level.

Once the input signal has been fully analyzed utilizing the highest priority triggering mode, the next highest priority triggering mode will be utilized. This process continues until all triggering modes have been utilized.

Anytime the oscilloscope triggers on any component of the input signal, either the desired signal or an undesired waveform, it will be stored for future, further analysis.

In this manner, a user does not need to alter the settings of the oscilloscope during the analysis of the input signal. The input signal will be thoroughly analyzed utilizing only an oscilloscope including a data processing system which has been suitably programmed to implement the present invention.

FIG. 1 illustrates a pictorial representation of an oscilloscope 10 including a data processing system 12 which may be utilized to implement the method and system of the present invention. A display 13 may be utilized to view a signal, or waveform. Data processing system 12 may be implemented utilizing any type of computer system which may be suitably programmed to execute the methods and processes described below. Data processing system 12 includes a central processing unit 14 and a memory 16.

Oscilloscope 10 may be coupled to a circuit under test 18 such that an input signal 20 is received by oscilloscope 10. Input signal 20 typically includes a desired input signal and various undesired waveforms. A user may utilize oscilloscope 10 to analyze the desired signal as well as the various undesired waveforms.

FIG. 2 depicts a high level flow chart illustrating a prioritization of a plurality of triggering modes, and the specification of a plurality of parameters for each of the plurality of triggering modes in accordance with the method and system of the present invention. The process starts as depicted by block 100 and thereafter passes to block 102 which illustrates a determination of whether or not to prioritize the plurality of triggering modes. If a determination is made that the plurality of triggering modes are to be prioritized, the process passes to block 104 which depicts a prioritization of the plurality of triggering modes. Thereafter, the process passes to block 106.

Referring again to block 102, if a determination is made that the plurality of triggering modes are not to be prioritized, the process passes to block 108 which illustrates the utilization of a default priority order. Those skilled in the art will recognize that any priority order of triggering modes may be utilized. Thereafter, the process passes to block 106.

Block 106 depicts the specification, for each of the triggering modes, of a start voltage level, a stop voltage level, a step voltage, and a sweep rate for each voltage level. The sweep rate is the duration during which the oscilloscope will attempt to trigger at any particular voltage level. The process then terminates as illustrated by block 110.

FIG. 3 illustrates a high level flow chart depicting an automatic and independent analysis of an input signal by an oscilloscope utilizing a plurality of triggering modes and their associated parameters in accordance with the method and system of the present invention. The process starts as depicted at block 150 and thereafter passes to block 152 which illustrates getting the next trigger mode in the priority hierarchy and the parameters specified for this trigger mode. Next, block 154 depicts setting the oscilloscope for the starting voltage level and the sweep rate specified for this trigger mode.

The process then passes to block 156 which illustrates a determination of whether or not the oscilloscope triggered on one of the undesired waveforms included within the input signal. If a determination is made that the oscilloscope did trigger on one of the undesired waveforms, the undesired waveform is stored in memory 16 as depicted by block 158. The triggering parameters utilized by the oscilloscope when the captured waveform is stored are also stored along with the captured waveform. A count is maintained of the number of times the oscilloscope triggered for each set of triggering parameters. The count is incremented each time the oscilloscope triggers for a particular set of triggering parameters. The count is stored in memory 16.

The process then passes to block 160. Referring again to block 156, if a determination is made that the oscilloscope did not trigger, the process passes to block 160.

Block 160 depicts a determination of whether or not the sweep rate for the current voltage level has expired. If a determination is made that the sweep rate has not expired, the process passes to block 156. Referring again to block 160, if a determination is made that the sweep rate has expired, the process passes to block 162 which illustrates the incrementing of the current voltage level by the voltage step specified for this triggering mode. The process passes to block 164 which depicts a determination of whether or not the stop voltage level has been reached. If a determination is made that the stop voltage level has not been reached, the process passes back to block 156. Referring again to block 164, if a determination is made that the stop voltage level has been reached, the process passes to block 152.

In this manner, the oscilloscope will automatically and independently test an input signal. The oscilloscope will attempt to trigger upon a component of the input signal using each triggering mode and the specified triggering parameters. The oscilloscope will analyze the input signal using a first triggering mode. The oscilloscope will step through each voltage level starting with a start voltage level. The current voltage level being utilized by the oscilloscope will be incremented by the specified step voltage level. The oscilloscope will continue its sweep for the duration of the specified sweep rate. Thereafter, the next voltage level will be utilized.

This process continues until each voltage level has been utilized. Thereafter, the oscilloscope will then attempt to trigger on a component of the input signal utilizing the next triggering mode. In a manner similar to that described above, the oscilloscope will automatically and independently attempt to trigger at each voltage level specified for this current triggering mode. The process continues until each triggering mode has been utilized.

For each waveform, or signal, upon which the oscilloscope was able to trigger, the waveform will be stored for future use.

While a preferred embodiment has been particularly shown and described, it will be understood by those skilled in the art that various changes in form and detail may be made therein without departing from the spirit and scope of the present invention.

What is claimed is:

1. A method in a data processing system included within an oscilloscope for independently analyzing a signal input into said oscilloscope, said oscilloscope including a plurality of triggering modes, said method comprising the steps of:
   specifying a plurality of trigger parameters for each of said plurality of triggering modes; and
   thereafter, said oscilloscope automatically analyzing said input signal independently from any user input utilizing each of said plurality of triggering modes and said plurality of trigger parameters specified for each of said plurality of triggering modes, including:
      determining if said oscilloscope triggered on one of said plurality of undesired waveforms; and
      in response to a determination that said oscilloscope triggered on one of said plurality of undesired waveforms, storing said one of said plurality of undesired waveforms.

2. The method according to claim 1, further comprising the step of storing a plurality of trigger parameters associated with one of said plurality of triggering modes utilized when said oscilloscope triggered on said one of said plurality of undesired waveforms.

3. The method according to claim 2, wherein said step of automatically analyzing further comprises the steps of:
   analyzing said input signal utilizing a first of said plurality of triggering modes and a first plurality of trigger parameters associated with said first of said plurality of triggering modes; and
   thereafter, automatically continuing said analyzing said input signal independently from any user input utilizing a second of said plurality of triggering modes and a second plurality of trigger parameters associated with said second of said plurality of triggering modes.

4. The method according to claim 3, further comprising the steps of:
   establishing said first plurality of parameters including a start voltage level, a stop voltage level, a voltage step, and a sweep rate; and
   said oscilloscope attempting to trigger on any of said plurality of undesired waveforms utilizing said a current voltage equal to said start voltage level and utilizing said sweep rate.

5. The method according to claim 4, further comprising the steps of:
   while said oscilloscope is attempting to trigger, determining an elapsed time;
   determining if said elapsed time is greater than said sweep rate;
   in response to said elapsed time being greater than said sweep rate, incrementing said current voltage by said voltage step; and
   said oscilloscope attempting to trigger on any of said plurality of undesired waveforms utilizing said current voltage and said sweep rate.

6. The method according to claim 5, further comprising the step of in response to said current voltage being equal to said stop voltage, automatically continuing said analyzing said input signal utilizing said second of said plurality of triggering modes and said second plurality of trigger parameters associated with said second of said plurality of triggering modes.

7. The method according to claim 6, further comprising the steps of
   prioritizing said plurality of trigger modes; and
   establishing a highest priority of said plurality of trigger modes as said first of said plurality of said triggering modes.

8. The method according to claim 7, further comprising the step of establishing a next highest priority of said plurality of trigger modes as said second of said plurality of said triggering modes.

9. The method according to claim 8, wherein said plurality of triggering modes includes an edge triggering mode.

10. The method according to claim 9, wherein said plurality of triggering modes includes a slew triggering mode.

11. The method according to claim 10, wherein said plurality of triggering modes includes a runt triggering mode.

12. The method according to claim 11, wherein said plurality of triggering modes includes a glitch triggering mode.

13. A data processing system included within an oscilloscope for independently analyzing a signal input into said oscilloscope, said oscilloscope including a plurality of triggering modes, comprising:
   means for specifying a plurality of trigger parameters for each of said plurality of triggering modes; and
   means for thereafter, said oscilloscope automatically analyzing said input signal independently from any user input sequentially utilizing each of said plurality of triggering modes and said plurality of trigger parameters specified for each of said plurality of triggering modes, including:
      means for determining if said oscilloscope triggered on one of said plurality of undesired waveforms; and
      means responsive to a determination that said oscilloscope triggered on one of said plurality of undesired waveforms, for storing said one of said plurality of undesired waveforms.

14. The system according to claim 13, further comprising means for storing a plurality of trigger parameters associated with one of said plurality of triggering modes utilized when said oscilloscope triggered on said one of said plurality of undesired waveforms.

15. The system according to claim 14, wherein said means for automatically analyzing further comprises:

means for analyzing said input signal utilizing a first of said plurality of triggering modes and a first plurality of trigger parameters associated with said first of said plurality of triggering modes; and means for thereafter, automatically continuing said analyzing said input signal independently from any user input utilizing a second of said plurality of triggering modes and a second plurality of trigger parameters associated with said second of said plurality of triggering modes.

16. The system according to claim 15, further comprising:

means for establishing said first plurality of parameters including a start voltage level, a stop voltage level, a voltage step, and a sweep rate; and means for said oscilloscope attempting to trigger on any of said plurality of undesired waveforms utilizing said a current voltage equal to said start voltage level and utilizing said sweep rate.

17. The system according to claim 16, further comprising:

means for while said oscilloscope is attempting to trigger, determining an elapsed time;

means for determining if said elapsed time is greater than said sweep rate;

means responsive to said elapsed time being greater than said sweep rate, for incrementing said current voltage by said voltage step; and means for said oscilloscope attempting to trigger on any of said plurality of undesired waveforms utilizing said current voltage and said sweep rate.

18. The system according to claim 17, further comprising means responsive to said current voltage being equal to said stop voltage, for automatically continuing said analyzing said input signal utilizing said second of said plurality of triggering modes and said second plurality of trigger parameters associated with said second of said plurality of triggering modes.

19. The system according to claim 18, further comprising:

means for prioritizing said plurality of trigger modes; and means for establishing a highest priority of said plurality of trigger modes as said first of said plurality of said triggering modes.

20. The system according to claim 19, further comprising means for establishing a next highest priority of said plurality of trigger modes as said second of said plurality of said triggering modes.

21. The system according to claim 20, wherein said plurality of triggering modes includes an edge triggering mode.

22. The system according to claim 21, wherein said plurality of triggering modes includes a slew triggering mode.

23. The system according to claim 22, wherein said plurality of triggering modes includes a runt triggering mode.

24. The system according to claim 23, wherein said plurality of triggering modes includes a glitch triggering mode.

* * * * *